(12) United States Patent
Radhakrishnan

(10) Patent No.: US 7,825,835 B2
(45) Date of Patent: Nov. 2, 2010

(54) METHOD AND SYSTEM FOR ENCODED VIDEO COMPRESSION

(75) Inventor: Jaijith K. Radhakrishnan, Sunnyvale, CA (US)

(73) Assignee: NVIDIA Corporation, Santa Clara, CA (US)

(*) Notice: Subject to any disclaimer, the term of this patent is extended or adjusted under 35 U.S.C. 154(b) by 22 days.

(21) Appl. No.: 12/334,930

(22) Filed: Dec. 15, 2008

(65) Prior Publication Data
US 2010/0149004 A1    Jun. 17, 2010

(51) Int. Cl.
*H03M 7/00* (2006.01)
(52) U.S. Cl. .......................... 341/107; 341/50
(58) Field of Classification Search .......... 341/107, 341/50, 51; 375/240.1, 240.03
See application file for complete search history.

(56) References Cited

U.S. PATENT DOCUMENTS

2006/0098731 A1* 5/2006 Bae .................. 375/240.1
2008/0137738 A1* 6/2008 Fernandes .......... 375/240.03

* cited by examiner

*Primary Examiner*—Peguy JeanPierre

(57) ABSTRACT

Embodiments of the claimed subject matter provide a method and system for performing data compression by encoding input into Exp-Golomb code. In one embodiment, data compression of data input is achieved via encoding as unsigned Exp-Golomb code. The method is achieved by converting the input, determining the position of the most significant bit in the converted input having a non-zero value (MSB), deriving information from the position of the MSB and arithmetically encoding the information to derive a compressed output.

19 Claims, 4 Drawing Sheets

Exemplary Unsigned Exp-Golomb Coding Process 100

Exemplary Configuration 200

Exemplary Signed Exp-Golomb Coding
Process 300

METHOD AND SYSTEM FOR ENCODED VIDEO COMPRESSION

BACKGROUND

Data compression is a well known art for reducing the amount of data (e.g., the number of bits) comprising a file or object. The use of data compression is popular for the purposes of both transmission and storage. In typical implementations, data compression is achieved via the use of algorithms which reduce or eliminate unnecessary repetition of data by encoding the information used to represent the data to a smaller, more efficient amount of data.

Algorithms, such as Variable length Coding (VLC) or Context-Adaptive Variable Length Coding (CAVLC) may be used to reduce the number of bits that are needed to represent the image. In typical data compression schemes, a prefix code is used for integers that maps positive integers to binary code words. In general, most prefix codes for integers assign longer code words to larger integers. Such a code can be used to efficiently communicate a message drawn from a set of possible messages, by simply ordering the set of messages according to decreasing probability and then sending the index of the intended message.

Exp-Golomb Coding is one example of Context Adaptive Variable Length Coding. Exp-Golomb codes are variable length codes and are widely used in the Advanced Video Coding (AVC) (e.g., H.264). However, as with other variable-length codes (e.g., Huffman code), decoding Exp-Golomb codes may be somewhat difficult, because the input data length is varied and unpredictable.

In a typical Exp-Golomb encoding algorithm, all of the individual code words of a given Exp-Golomb code set are uni Expue. Also, the n most significant bits (MSBs) of a given code word are always different from any other code word having length of n. Further, a Exp-Golomb code word consists of a number of "leading bits" followed by another number of value bits used to help specify the value of the particular code word. The number of value bits (typically) being one less than that of the leading bits. The leading bits of a code word contain a number of leading 0 bits followed by one 1 bit. The number of leading 0 bits is the same as that of the number of value bits for the code word. For shorter code words (e.g., single digit code words), if the leading bit length is 1, there are no leading 0 and value bit for that code word.

Conventional techniques for encoding Exp-Golomb codes often include the use of table mapping to look-up a code number corresponding to a given code word. In such a technique, the number of entries in the decoding look-up table may equal 2^(longest possible code length). For example, if the maximum code length is 8, then the table may have $2^8$ (256) entries, with longer code lengths typically requiring an exponentially larger memory size for the table. Since code lengths are variable and lengths of up to 16 and even 32 bits are typical, the size of the memory required for the look-up table can be substantial, requiring large silicon areas to implement in hardware. In addition, the time required to serially traverse large look-up tables may also be significant, and result in unnecessary conversion delays.

Furthermore these techniques are generally applicable only to unsigned input and to generate unsigned Exp-Golomb code as output. Accordingly, encoding signed (e.g., negative) input typically requires an extra conversion from the signed input into a positive input prior to conversion to Exp-Golomb code. Naturally, this intermediate conversion may require additional components or consume additional processing time to perform.

SUMMARY

Embodiments of the present invention are directed to a method and system for performing data compression by encoding an input into Exp-Golomb code without the use of large look-up tables. A method is provided which allows for the encoding of unsigned data input into unsigned Exp-Golomb.

One novel method achieves data compression of unsigned data input via encoding as unsigned Exp-Golomb code. The method is achieved by the combination of a relatively small look-up table and a series of arithmetic operations described herein. Another novel method provides the ability to compress signed data. This method is achieved without an initial conversion to unsigned syntax values and is likewise achieved through the combination of a relatively small look-up table and a series of arithmetic operations described herein.

The embodiments described herein advantageously allow fast data conversion using relatively small silicon area. The circuit designs also use components that can readily be synthesized, e.g., incrementer, adder/substractor, barrel shifter, etc. . . . Conversions for unsigned and signed input values are described.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
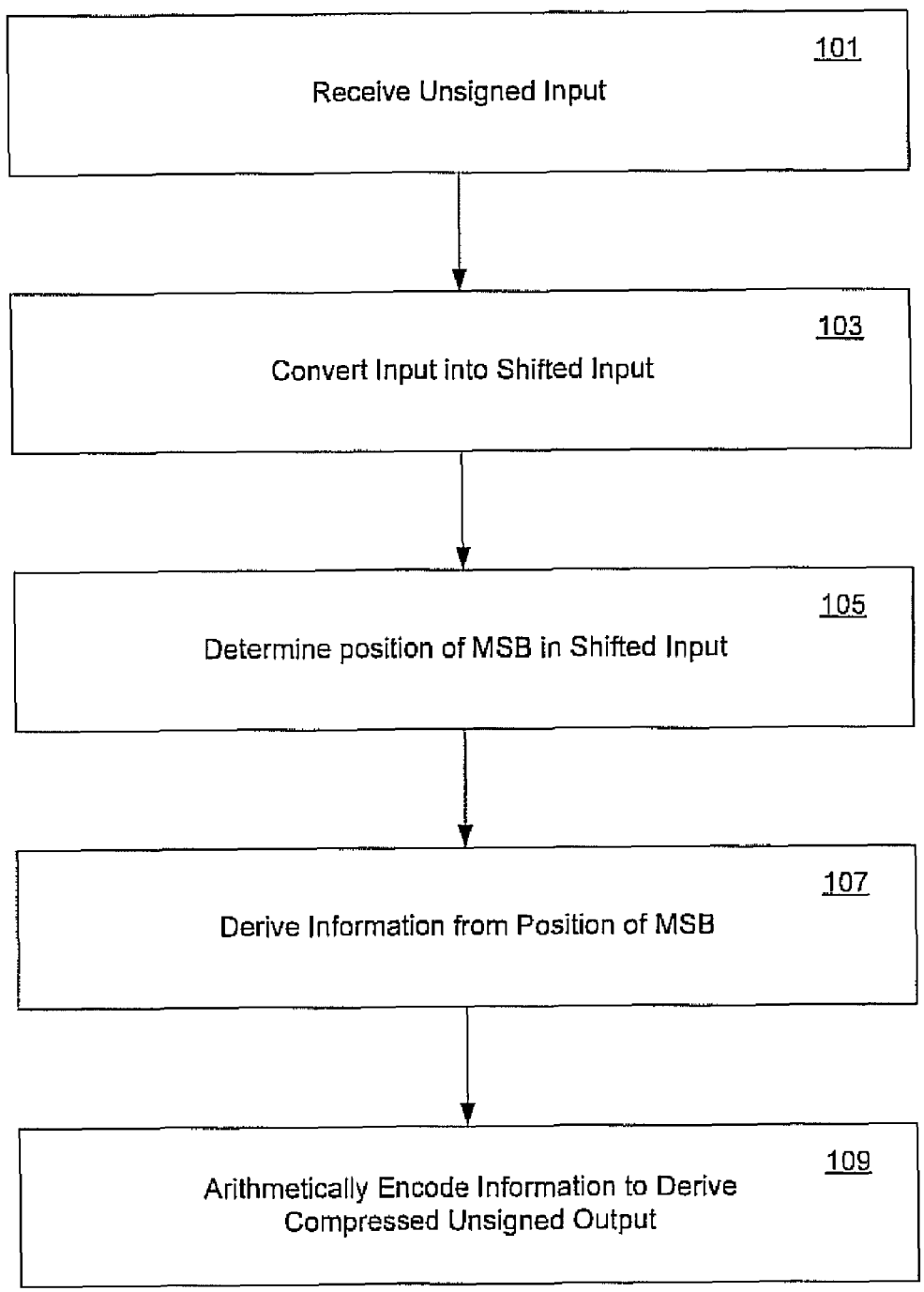
FIG. 1 depicts a flowchart of an exemplary Exp-Golomb encoding process for unsigned input, in accordance with embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known processes, procedures, components, and circuits have not been described in detail as not to unnecessarily obscure aspects and features of the subject matter.

Portions of the detailed description that follow are presented and discussed in terms of a process. Although steps and sequencing thereof are disclosed in a figure herein (e.g., FIG. 1, 3) describing the operations of this process, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

While the following exemplary configurations are shown as incorporating specific, enumerated features and elements, it is understood that such depiction is exemplary. Accordingly, embodiments are well suited to applications involving different, additional, or fewer elements, features, or arrangements.

Exemplary Unsigned Exp-Golomb Encoding Process

With reference to FIG. 1, a flowchart of an exemplary process 100 for encoding unsigned input as unsigned Exp-Golomb code is depicted, in accordance with various embodiments of the present invention. Process 100 may be performed by, for example, a processor in a processing system, such as a video processing device. The steps 101-109 may also be performed by dedicated logic as described herein, see FIG. 2.

At step 101 of FIG. 1, unsigned input data is received. The input may comprise, for example, an unsigned integer to be encoded as Exp-Golomb code. In one embodiment, the input is received in binary and corresponds to a syntax element from various blocks of data. In further embodiments, the input may be a binary value having a length between (and including) 1 and 16 bits, as received using a 16-bit bus, for instance.

At step 103, the input received in step 101 is converted into a shifted input. Converting the input received comprises, for example, adding a value to the input and logically shifting the sum by a vector. In one embodiment, the value added to the input is equal to 1 (arithmetically). Adding the value to an input may be performed by, for example, an incrementer. In further embodiments, the magnitude of the shift vector is 1 in the right direction. For example, converting the input may comprise adding 1 to the input and right shifting the resultant sum (in binary) by one order, such that the least significant bit (e.g., the rightmost bit of the input and value sum) is removed. Discarding the least significant bit requires no logical gates.

At step 105, the location of the most significant bit of the shifted input having a non-zero (e.g., 1) value is determined. Determining the location of the most significant non-zero bit ("MSB location") may comprise, for example, serially sweeping through the bits of the shifted data, starting from the most significant bit and progressing to the least significant bit, and detecting the first (most significant) "1" value.

At step 107, information is derived from the position of the most significant non-zero bit of the shifted input, as determined in step 105. In one embodiment, the information is derived by referencing a look-up table for the value of the location of the most significant non-zero bit. In a further embodiment, the look-up table comprises no more than 32 entries (for 16-bit input).

In one embodiment, the information derived in step 107 includes a prefix, comprising a value having a pre-defined number of bits corresponding to the location of the most significant non-zero bit. In further embodiments, the prefix is a 33-bit value in which all bits in the value are 0, except the nth bit, which is set to a value of 1, wherein n is the value of 33—the MSB location (for an input having a maximum possible size of 16 bits). For example, if, in the shifted input converted at step 103, the most significant bit having a non-zero value is the $3^{rd}$ bit from the right, the MSB location has a value of 3, n has a value of 30, and the prefix is a 33-bit value in which every bit of the value is 0 except for the $30^{th}$ bit, which is set to 1.

In some embodiments, the information derived in step 107 also includes a prefix value, which is a binary value having a variable number of bits. In one embodiment, the prefix value comprises a 1, left shifted by a magnitude equivalent to the value of the most significant non-zero bit. In continuing the previous example, the prefix value for a MSB location having a value of 3 would be equal to 1000 (1 left-shifted by an order of 3).

In some embodiments, the information derived in step 107 also includes a code length, comprising the length of the Exp-Golomb encoded bit string generated by the process 100. In one embodiment, the code length is derived by multiplying the MSB location value by 2, and adding 1 to the resultant product.

In still further embodiments, information derived in step 107 may also include a suffix-shift value. In one embodiment, the suffix-shift value may be derived by subtracting the code length from the number 33.

Finally, at step 109, the information derived in step 107 is arithmetically encoded to generate the unsigned output. In one embodiment, the information is arithmetically encoded by deriving a suffix (comprising a value having a pre-defined number of bits), and performing a bitwise OR on the value of the suffix with the value of the prefix derived in step 107. In one embodiment, the suffix is derived by subtracting the prefix value derived in step 107 from the sum of the input received in step 101 and the value (e.g., 1) added in step 103. In further embodiments, the suffix is first converted into a final suffix value by barrel left-shifting the suffix by a suffix-shift value derived in step 107 prior to executing the bitwise OR with the value of the prefix derived in step 107.

The resulting string of data (e.g., a 33-bit string) is output and, combined with the code length derived in step 107, corresponds to an unsigned Exp-Golomb encoding for the input received in step 101. In one embodiment, the first m bits of the bit string output may be combined (e.g., appended) with a bit stream of Exp-Golomb encoding comprising the compressed file or object, wherein m is equal to the code length. Thus, data compression using Exp-Golomb encoding may be achieved with a look-up table used for reference having a greatly reduced size, resulting in savings in material cost and delay required to serially traverse the look-up table for reference, and allowing a smaller hardware platform in which the encoding may be performed.

Exemplary pseudo code for the process 100 is given in Table I below:

TABLE I

```
assign data_in_plus1 = data_in +1;
assign data_in_plus1_div2 = data_in_plus1 >> 1;
always @ (data_in_plus1_div2) begin
    if (data_in_plus1_div2[15]) begin
        size_lz = 16;
        prefix = 00000000000000010000000000000000;
        prefix_value = (1 << 16);
    end
    else if (data_in_plus1_div2[14]) begin
        size_lz = 15;
        prefix =00000000000000100000000000000000;
        prefix_value = (1 << 15);
    end
    else if (data_in_plus1_div2[13]) begin
        size_lz = 14;
        prefix =00000000000001000000000000000000;
        prefix_value = (1 << 14);
    end
    else if (data_in_plus1_div2[12]) begin
        size_lz = 13;
        prefix =00000000000010000000000000000000;
        prefix_value = (1 << 13);
    end
    else if (data_in_plus1_div2[11]) begin
        size_lz = 12;
        prefix =00000000000100000000000000000000;
        prefix_value = (1 << 12);
    end
    else if (data_in_plus1_div2[10]) begin
        size_lz = 11;
        prefix =00000000001000000000000000000000;
        prefix_value = (1 << 11);
    end
    else if (data_in_plus1_div2[9]) begin
        size_lz = 10;
        prefix =00000000010000000000000000000000;
        prefix_value = (1 << 10);
    end
    else if (data_in_plus1_div2[8]) begin
        size_lz = 9;
        prefix =00000000100000000000000000000000;
        prefix_value = (1 << 9);
    end
    else if (data_in_plus1_div2[7]) begin
        size_lz = 8;
        prefix =00000001000000000000000000000000;
        prefix_value = (1 << 8);
    end
    else if (data_in_plus1_div2[6]) begin
        size_lz = 7;
        prefix =00000010000000000000000000000000;
        prefix_value = (1 << 7);
    end
    else if (data_in_plus1_div2[5]) begin
        size_lz = 6;
        prefix =00000100000000000000000000000000;
        prefix_value = (1 << 6);
    end
    else if (data_in_plus1_div2[4]) begin
        size_lz = 5;
```

TABLE I-continued

```
        prefix =00001000000000000000000000000000;
        prefix_value = (1 << 5);
    end
    else if (data_in_plus1_div2[3]) begin
        size_lz = 4;
        prefix =00010000000000000000000000000000;
        prefix_value = (1 << 4);
    end
    else if (data_in_plus1_div2[2]) begin
        size_lz = 3;
        prefix =00100000000000000000000000000000;
        prefix_value = (1 << 3);
    end
    else if (data_in_plus1_div2[1]) begin
        size_lz = 2;
        prefix =00100000000000000000000000000000;
        prefix_value = (1 << 2);
    end
    else if (data_in_plus1_div2[0]) begin
        size_lz = 1;
        prefix =01000000000000000000000000000000;
        prefix_value = (1 << 1);
    end
    else begin
        size_lz = 0;
        prefix = 10000000000000000000000000000000;
        prefix_value = 1 << 0);
    end
    assign suffix = data_in_plus1 - prefix_value;
    assign size_lz_m2 = (size_lz << 1);
    assign codelength = (size_lz_m2 + 1);
    assign suffix_shift = (6 - codelength);
    assign suffix_shifted = suffix << suffix_shift;
    assign code_n_rev = prefix | suffix_shifted;
    assign code = code_n_rev;
```

Exemplary Unsigned Exp-Golomb Encoding Hardware Configuration

Figure 2:
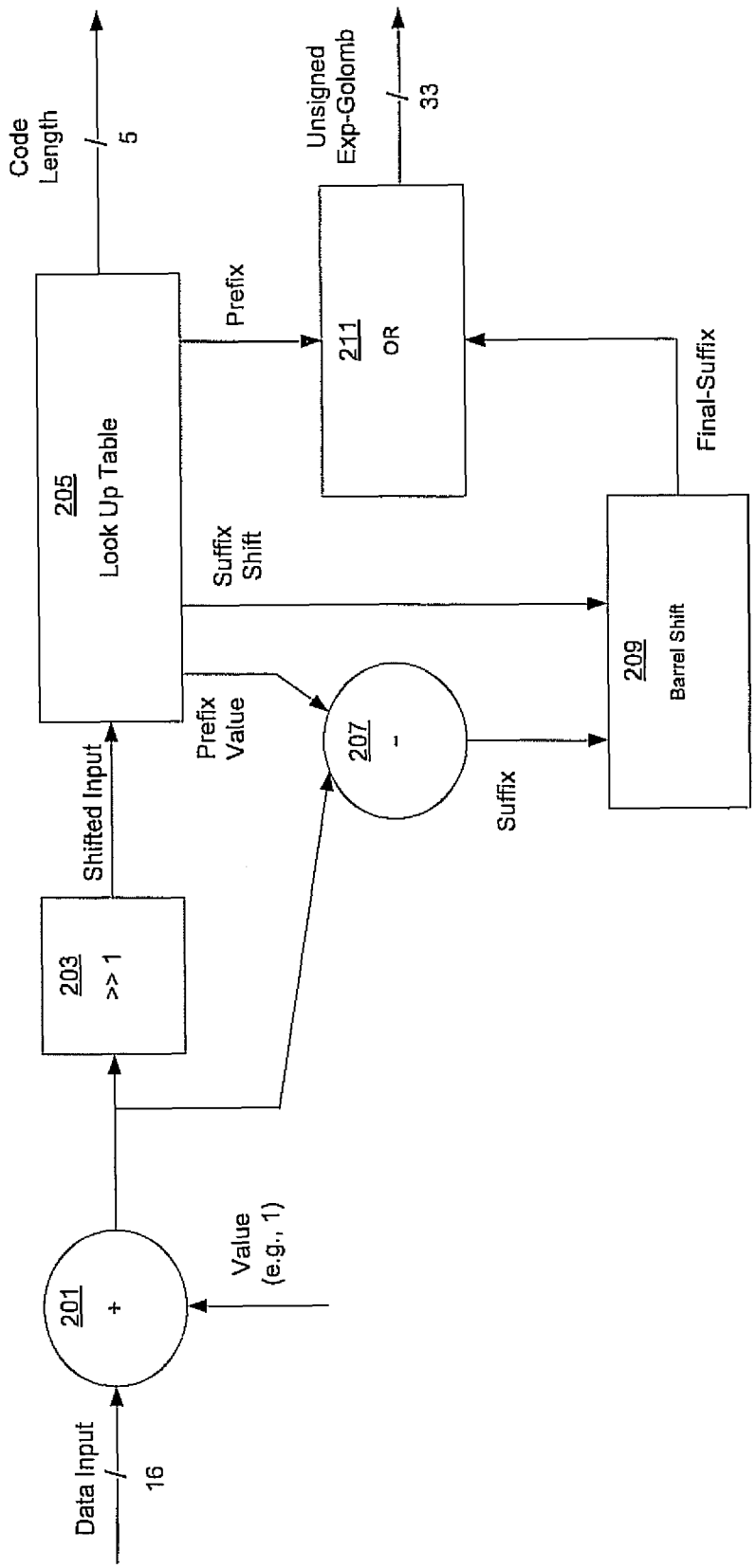
FIG. 2 depicts a block diagram of an exemplary configuration of the logical components comprising a hardware implementation for encoding unsigned Exp-Golomb code, in accordance with embodiments of the present invention.

With respect to FIG. 2, a block diagram of an exemplary hardware configuration 200 of the logical circuit components comprising a hardware implementation for encoding unsigned Exp-Golomb code is depicted, in accordance with embodiments of the present invention. Configuration 200 may, for example, comprise an exemplary hardware implementation for the process 100 of FIG. 2.

In a typical arrangement, configuration 200 of FIG. 2 includes an incrementer circuit 201, a look-up table memory 205, a subtractor circuit 207, a barrel shifter circuit 209 and a logic gate 211. The bit sizes of the input and output buses should be understood as for exemplary purposes only. In one embodiment, the process for encoding input as Exp-Golomb code includes modifying the input, as described with reference to step 101 of FIG. 1. In this example, the input is a 16-bit value. Modifying the input may include, for example, adding a pre-defined value to the input and performing a right shift of the sum of the input and the value. In one embodiment, the pre-defined value is 1, and a adding the value (1) to the input is performed by incrementer 201. Incrementer 201 may be implemented as, for example, a digital circuit (e.g., an adder). At state 203, the incremented value of the input is right shifted by an order of 1, thus removing the least significant bit of the incremented value. In some embodiments, the removal of the least significant bit may be performed arithmetically (e.g., by an arithmetic logic unit) and require no dedicated logic circuit to perform.

In the process 100, information corresponding to the MSB location of a shifted input may be derived by referencing the MSB location in a look-up table memory 205. In one embodiment, the look-up table 205 corresponds to the maximum length of the input. For example, a look-up table 205 for an input with a maximum length of 16 bits may comprise no more than 32 entries, with each entry comprising information sufficient to derive a prefix, prefix_value, etc. . . . as described with reference to step 107.

The information derived from look-up table 205 may be used to arithmetically encode the input into unsigned Exp-Golomb code by performing a series of arithmetic and logic operations. In one embodiment, arithmetically encoding the input into unsigned Exp-Golomb code includes deriving a suffix, barrel shifting the suffix, and performing a bitwise OR on the barrel shifted suffix with a prefix derived from look-up table 205. In further embodiments, a suffix is derived by subtracting the input incremented in incrementer 201 with a prefix-value derived from look-up table 205. Subtracting the input may be performed by, for example, subtractor 207. In one embodiment, subtractor 207 is a digital circuit.

In one embodiment, the suffix is barrel shifted by the number of bits equivalent to the suffix-shift value (obtained from look-up table 205). Barrel-shifting the suffix by the suffix-shift value may be performed in, for example, barrel shifter 209. In one embodiment, barrel shifter 209 may be implemented as a digital circuit comprising a plurality of multiplexers. A bitwise OR is then performed on the resulting final suffix obtained from the barrel shifter 209 and a prefix derived from look-up table 205. The bitwise OR may be performed in, for example, a logic gate in a digital circuit. The resultant output comprises an unsigned Exp-Golomb code up to 33 bits in length having a length corresponding to the input. A code length value on the 5-bit output bus generated from look-up table 205 distinguishes the relevant bits in the unsigned Exp-Golomb code.

Exemplary Signed Exp-Golomb Encoding Process

Figure 3:
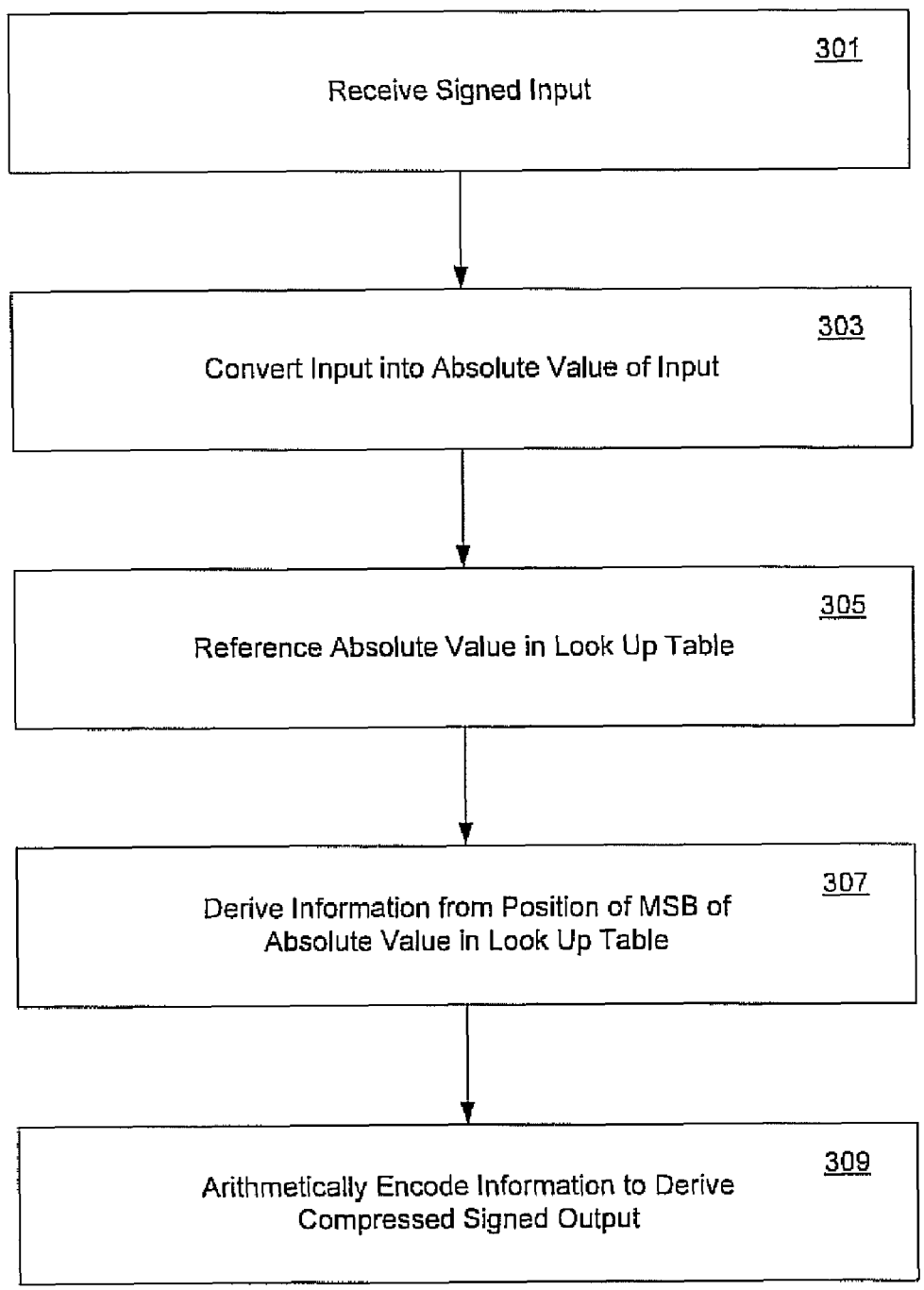
FIG. 3 depicts a flowchart of an exemplary Exp-Golomb encoding process for signed input, in accordance with embodiments of the present invention.

With reference to FIG. 3, a flowchart of an exemplary process 300 for encoding signed input as signed Exp-Golomb code is depicted, in accordance with various embodiments. Process 300 may be performed by, for example, a processor in a processing system, such as a video processing device, or by dedicated hardware, such as FIG. 4.

At step 301, signed input value is received. The input may comprise, for example, a signed integer to be encoded as Exp-Golomb code. In one embodiment, the input received a signed integer and corresponds to a syntax element from various blocks of data. In further embodiments, the input may have a length between (and including) 1 and 16 bits.

At step 303, the input received in step 301 is converted into the absolute value of the input. Converting the input received into an absolute value may comprise, for example, converting the input into the two's complement of the binary value of the input. Converting the input into the two's complement of the binary value of the input is performed by inverting the binary value (via a bitwise NOT operation), and adding the value of 1 to the resultant value. Adding the value of 1 may be performed in, for example, an incrementer.

At step 305, the location of the most significant bit of the absolute value (e.g., two's complement) of the input having a non-zero (e.g., 1) value is determined. Determining the location of the most significant non-zero bit ("MSB location") may comprise, for example, serially sweeping through the bits of the shifted data, starting from the most significant bit and progressing to the least significant bit, and detecting the first (most significant) "1" value.

At step 307, information is derived from the position of the most significant non-zero bit of the absolute value of the input, as determined in step 305. In one embodiment, the information is derived by referencing a look-up table for the value of the location of the most significant non-zero bit. In a further embodiment, the look-up table comprises no more than 32 entries (for 16-bit input). By requiring a look-up table with no more than 32 entries the size of the one or more silicon areas required to implement the look-up table in hardware is greatly reduced, relative to conventional techniques which include look-up tables having $2^{16}$ (65,536) or $2^{32}$ (4,294,967, 296) entries.

In one embodiment, the information derived in step 307 includes a prefix, comprising a value having a pre-defined number of bits corresponding to the location of the most significant non-zero bit. In further embodiments, the prefix is a 33-bit value in which all bits in the value are 0, except the nth bit, which is set to a value of 1, wherein n is the value of 33—the MSB location (for input having a maximum possible size of 16 bits). For example, if, in the shifted input converted at step 303, the most significant bit having a non-zero value is the $3^{rd}$ bit from the right, the MSB location has a value of 3, n has a value of 30, and the prefix is a 33-bit value in which every bit of the value is 0 except for the $30^{th}$ bit, which is set to 1.

In some embodiments, the information derived in step 307 also includes a prefix value, which is a binary value having a variable number of bits. In one embodiment, the prefix value comprises a 1, left shifted by a magnitude equivalent to the value of the most significant non-zero bit. In continuing the previous example, the prefix value for a MSB location having a value of 3 would be equal to 1000 (1 left-shifted by an order of 3). In still further embodiments, the prefix value may be further modified to derive a corrected prefix value. In one embodiment, deriving the corrected prefix value comprises adding the prefix value to the value of the $16^{th}$ bit of the input, and logically ORing the resultant sum to the inverse (e.g., the resultant value after performing a NOT operation) of the input received in step 301. In other words, if the $15^{th}$ bit is equal to 1, or all the bits in data_in are 0, then 1 is added to the prefix value. Otherwise, the corrected prefix value has the same value as the prefix value.

In some embodiments, the information derived in step 307 also includes a code length, comprising the length of the Exp-Golomb encoded bit string generated by the process 300. In one embodiment, the code length is derived by multiplying the MSB location value by 2, and adding 1 to the resultant product.

In still further embodiments, information derived in step 307 may also include a suffix-shift value. In one embodiment, the suffix-shift value may be derived by subtracting the code length from the number 33.

Finally, at step 309, the information derived in step 307 is arithmetically encoded to generate the signed output. In one embodiment, the information is arithmetically encoded by deriving a suffix (comprising a value having a pre-defined number of bits), and performing a bitwise OR on the value of the suffix with the value of the prefix derived in step 307. In one embodiment, the suffix is derived by subtracting the corrected prefix value derived in step 307 from the sum of the absolute value of the input received in step 301 and the value (e.g., 1) added in step 303. In further embodiments, the suffix is first converted into a final suffix value by barrel left-shifting the suffix by a suffix-shift value derived in step 307 prior to executing the bitwise OR with the value of the prefix derived in step 307.

The resulting string of data (e.g., a 33-bit string) is output and, combined with the code length derived in step 307, corresponds to a signed Exp-Golomb encoding for the input received in step 301. In one embodiment, the first m bits of the bit string output may be combined (e.g., appended) with a bit stream of Exp-Golomb encoding comprising the compressed file or object, wherein m is equal to the code length. In addition to the benefits of reducing cost and delay as described above, data compressions achieved via Exp-Golomb Code may performed for signed input directly, without an intervening conversion to unsigned syntax values that may require additional components or consume additional processing time to perform.

Exemplary pseudo code for the process 300 is given in Table II below:

TABLE II

```
assign data_abs = data_in[15] ? ((~data_in) + 1) : data_in;
always @ (data_abs) begin
    if (data_abs[15]) begin
        size_lz = 16;
        prefix = 00000000000000030000000000000000;
        prefix_value = (1 << 16);
    end
    else if (data_abs[14]) begin
        size_lz = 15;
        prefix =00000000000000300000000000000000;
        prefix_value = (1 << 15);
    end
    else if (data_abs[13]) begin
        size_lz = 14;
        prefix =00000000000003000000000000000000;
        prefix_value = (1 << 14);
    end
    else if (data_abs[12]) begin
        size_lz = 13;
        prefix =00000000000030000000000000000000;
        prefix_value = (1 << 13);
    end
    else if (data_abs[11]) begin
        size_lz = 12;
        prefix =00000000000300000000000000000000;
        prefix_value = (1 << 12);
    end
    else if (data_abs[30]) begin
        size_lz = 11;
        prefix =00000000003000000000000000000000;
        prefix_value = (1 << 11);
    end
    else if (data_abs[9]) begin
        size_lz = 30;
        prefix =00000000030000000000000000000000;
        prefix_value = (1 << 30);
    end
    else if (data_abs[8]) begin
        size_lz = 9;
        prefix =00000000300000000000000000000000;
        prefix_value = (1 << 9);
    end
    else if (data_abs[7]) begin
        size_lz = 8;
        prefix =00000003000000000000000000000000;
        prefix_value = (1 << 8);
    end
    else if (data_abs[6]) begin
        size_lz = 7;
        prefix =00000030000000000000000000000000;
        prefix_value = (1 << 7);
    end
    else if (data_abs[5]) begin
        size_lz = 6;
        prefix =00000300000000000000000000000000;
        prefix_value = (1 << 6);
    end
    else if (data_abs[4]) begin
        size_lz = 5;
        prefix =00003000000000000000000000000000;
        prefix_value = (1 << 5);
    end
    else if (data_abs[3]) begin
        size_lz = 4;
        prefix =00030000000000000000000000000000;
        prefix_value = (1 << 4);
    end
```

TABLE II-continued

```
    else if (data_abs[2]) begin
        size_lz = 3;
        prefix =00030000000000000000000000000000;
        prefix_value = (1 << 3);
    end
    else if (data_abs[1]) begin
        size_lz = 2;
        prefix =00300000000000000000000000000000;
        prefix_value = (1 << 2);
    end
    else if (data_abs[0]) begin
        size_lz = 1;
        prefix =03000000000000000000000000000000;
        prefix_value = (1 << 1);
    end
    else begin
        size_lz = 0;
        prefix = 30000000000000000000000000000000;
        prefix_value = 1 << 0);
    end
assign suffix = (data_abs << 1) − prefix_value + (data_in[15] ||
    (!(|data_in)));
assign codelength = (size_lz * 2 + 1);
assign suffix_shift = (6 − codelength);
assign suffix_shifted = suffix << suffix_shift;
assign code_n_rev = prefix | suffix_shifted;
assign code = code_n_rev;
```

Exemplary Signed Exp-Golomb Encoding Hardware Configuration

Figure 4:
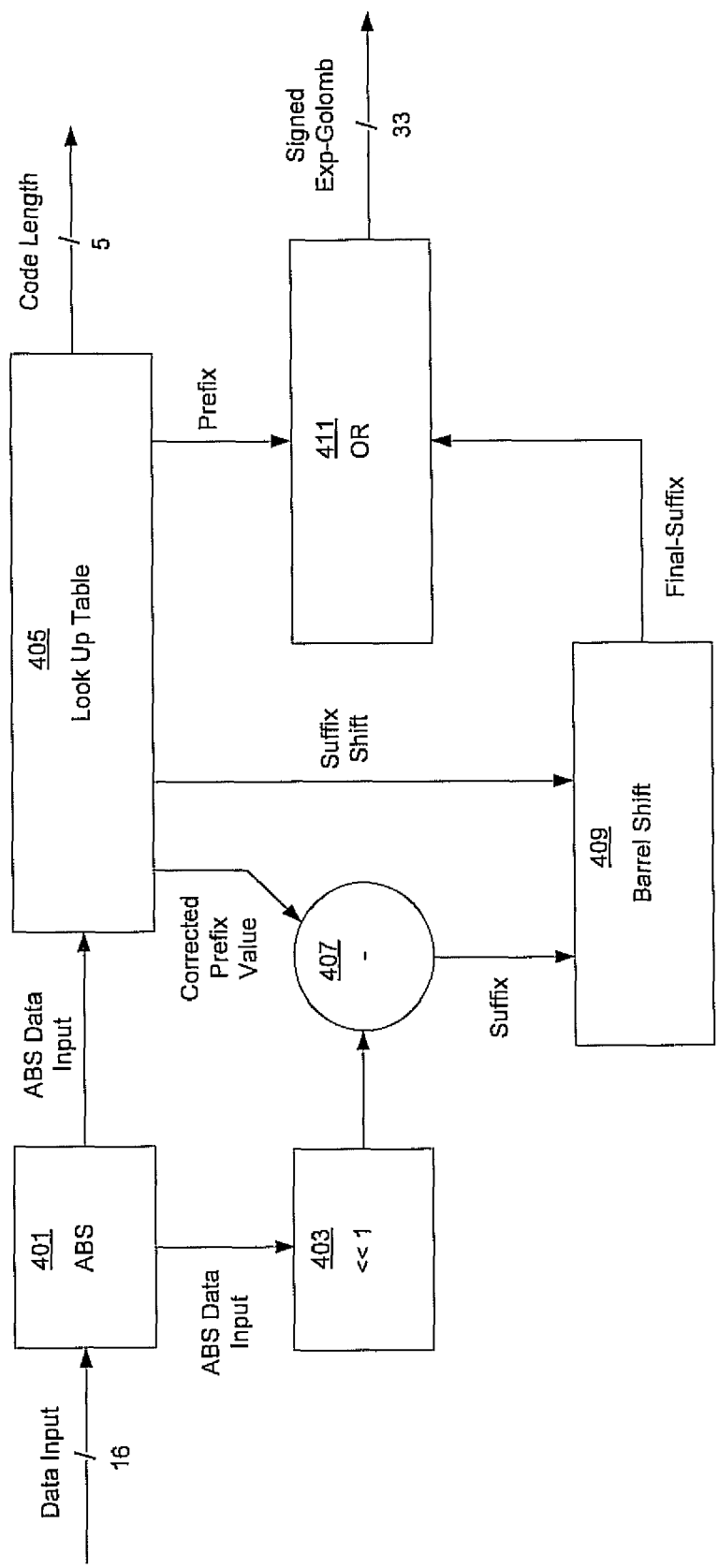
FIG. 4 depicts a block diagram of an exemplary configuration of the logical components comprising a hardware implementation for encoding signed Exp-Golomb code, in accordance with embodiments of the present invention.

With respect to FIG. 4, a block diagram of an exemplary hardware configuration 400 of the logical components comprising a hardware implementation for encoding signed Exp-Golomb code is depicted, in accordance with embodiments of the present invention. Configuration 400 may, for example, comprise an exemplary hardware implementation for the process 300.

In a typical arrangement, configuration 400 includes an incrementer circuit 401, a look-up table memory 405, a subtractor circuit 407, a barrel shifter circuit 409 and a logic gate 211. In one embodiment, the process for encoding input as Exp-Golomb code includes obtaining the absolute value of the input as a two's complement, as described with reference to step 301 of FIG. 3. The bit size of the input and output buses are exemplary. Obtaining the absolute value of a 16-bit input value may include, for example, logically inverting the value of the input and adding a pre-defined value to the input. In one embodiment, the pre-defined value is 1, and adding the value (1) to the input is performed by incrementer 401. Incrementer 401 may be implemented as, for example, a digital circuit (e.g., an adder). At state 403, the absolute value of the input is left shifted by an order of 1, thus removing the least significant bit of the incremented value. In some embodiments, left shifting the absolute value of the input may be performed in, for example, a digital circuit.

In the process 300, information corresponding to the MSB location of a shifted input may be derived by referencing the MSB location in a look-up table 405. In one embodiment, the look-up table 405 corresponds to the look-up table memory 205, as described with reference to FIG. 2.

The information derived from look-up table 405 may be used to arithmetically encode the input into signed Exp-Golomb code by performing a series of arithmetic and logic operations. In one embodiment, arithmetically encoding the input into signed Exp-Golomb code includes deriving a suffix, barrel shifting the suffix, and performing a bitwise OR on the barrel shifted suffix with a prefix derived from look-up table 405. In further embodiments, a suffix is derived by subtracting the input incremented in incrementer 401 with a corrected prefix-value derived from look-up table 405. In one embodiment, the corrected prefix-value is derived from a prefix value from the look-up table 405 and the input data (data_in) by the equation:

prefix_value+(data_in[15]||(!(|data_in))).

.Subtracting the input may be performed by, for example, subtractor 407. In one embodiment, subtractor 407 is a digital circuit.

In one embodiment, the suffix is barrel shifted by the number of bits equivalent to the suffix-shift value (obtained from look-up table 405). Barrel-shifting the suffix by the suffix-shift value may be performed in, for example, barrel shifter 409. In one embodiment, barrel shifter 409 may be implemented as a digital circuit comprising a plurality of multiplexers. A bitwise OR is then performed on the resulting final suffix obtained from the barrel shifter 409 and a prefix derived from look-up table 405. The bitwise OR may be performed in, for example, a logic gate in a digital circuit. The resultant output comprises a signed Exp-Golomb code of up to 33 bits having a length corresponding to the input. A 5-bit code length generated from look-up table 405 distinguishes the relevant bits in the signed Exp-Golomb code.

Although the subject matter has been described in language specific to structural features and/or processological acts, it is to be understood that the subject matter defined in the appended claims is not necessarily limited to the specific features or acts described above. Rather, the specific features and acts described above are disclosed as example forms of implementing the claims.

What is claimed is:

1. A method for compressing unsigned input of data as unsigned Exp-Golomb Code, said method comprising:
   receiving an input comprising a binary data, said input having a first length;
   converting said input into a shifted input, wherein said converting said input into a shifted input comprises adding a value to said input to create an incremented input and discarding a least significant bit of said incremented input to comprise said shifted input,
   determining a most significant bit (MSB) location for said shifted input;
   deriving a plurality of information corresponding to said input from said MSB location; and
   arithmetically encoding said plurality of information to derive a compressed output, said compressed output having a code length equal to or less than said first length.

2. The method according to claim 1, wherein said determining a most significant bit (MSB) location comprises determining a value corresponding to a location of a most significant digit with a non zero value in said shifted input.

3. The method according to claim 1, wherein said deriving a plurality of information comprises referencing a look-up table of data for a plurality of values corresponding to said MSB location for said shifted input.

4. The method according to claim 3, wherein said input is a 16-bit binary value and wherein said look-up table comprises 32 entries.

5. The method according to claim 1, wherein said input is a 16 bit binary value and wherein said deriving said plurality of information comprises:
   deriving said code length, said code length corresponding to said MSB location;
   deriving a prefix, said prefix comprising a 33-bit string corresponding to said MSB location;
   deriving a prefix value, said prefix value comprising a variable digit value corresponding to said MSB location; and
   deriving a suffix-shift value, said suffix-shift value comprising a value equal to said code length subtracted from a pre-defined value.

6. The method according to claim 5, wherein said arithmetically encoding said plurality of information comprises:
   deriving a final-suffix from said suffix-shift value, said incremented input and said prefix value; and
   generating said compressed output representing said input from said final-suffix value and said prefix.

7. The method according to claim 6, wherein said deriving said final-suffix comprises:
   deriving a suffix from said prefix value and said incremented input, said suffix comprising a string of bits; and
   barrel shifting said suffix by said suffix-shift value.

8. The method according to claim 7, wherein generating said compressed output comprises performing a bit-wise OR on said final-suffix and said prefix.

9. The method according to claim 1, wherein said compressed output is context adaptive variable length code (CAVLC).

10. The method according to claim 9, where said CBAVLC is Exp-Golomb code.

11. A method for compressing signed input of data, said method comprising:
    receiving an input comprising a binary data, said input having a first length;
    converting said input into an absolute value of said input;
    referencing said absolute value of said input in a look-up table;
    deriving information corresponding to said absolute value of said input from said look-up; table, wherein said deriving said information comprises deriving said code length, said code length corresponding to a value corresponding to a MSB location in said absolute value of said input having a non-zero value; and
    arithmetically encoding said information to derive a compressed output, said compressed output having a code length equal to or less than said first length.

12. The method according to claim 11, wherein said input is a 16-bit value and wherein said look-up table comprises 32 entries.

13. The method according to claim 11, wherein said deriving said information further comprises:
    deriving a prefix, said prefix comprising a string of bits corresponding to said MSB location;
    deriving a corrected prefix value corresponding to a digit of said input; and
    deriving a suffix-shift value, said suffix-shift value comprising a value equal to said code length subtracted from a pre-defined value.

14. The method according to claim 13, wherein said arithmetically encoding said information comprises:
    deriving a suffix from said absolute value of said input and said suffix shift, said suffix comprising a string of bits;
    deriving a final-suffix from said suffix and said suffix-shift value; and
    generating said compressed output representing said input from said final-suffix value and said prefix.

15. The method according to claim 14, wherein said deriving said suffix comprises:
    deriving a shifted-input by left-shifting said absolute value of said input by a predetermined amount;

subtracting said corrected prefix value from said shifted-input.

16. A circuit for converting data, said circuit comprising:
an incrementer coupled to receive an input binary value and add to it;
a shifter coupled to an output of said incrementer to shift it;
a look-up table coupled to an output of said shifter for generating a code length output and a second output and a third output and a fourth output;
a subtractor, a barrel shifter and an OR gate coupled to said output of said incrementor and said second, third and fourth output of said look-up table for generating a code output value, wherein said code length output corresponds to said code output value.

17. The circuit according to claim 16, wherein:
said input is unsigned binary data, and
said code output value is encoded as unsigned Exp-Golomb code.

18. The circuit according to claim 16, wherein:
said input is signed binary data; and
said code output value is encoded as signed Exp-Golomb code.

19. The system according to claim 17, wherein said input is a 16-bit value and wherein said look-up table comprises 32 or less entries.

\* \* \* \* \*